United States Patent [19]
Barbour et al.

[11] Patent Number: 5,858,559
[45] Date of Patent: Jan. 12, 1999

[54] METHOD FOR ALTERING THE LUMINESCENCE OF A SEMICONDUCTOR

[75] Inventors: J. Charles Barbour; Duane B. Dimos, both of Albuquerque, N. Mex.

[73] Assignee: Sandia Corporation, Albuquerque, N. Mex.

[21] Appl. No.: 964,739

[22] Filed: Oct. 21, 1992

[51] Int. Cl.$^6$ ........................................ C25F 3/12
[52] U.S. Cl. .................. 428/690; 428/620; 428/641; 428/642; 437/17; 437/20; 437/170
[58] Field of Search ...................... 428/620, 641, 428/642, 690; 156/625; 29/25.1; 437/228, 225, 80, 20, 17, 170; 204/129.3, 129.65, 129.75

[56] References Cited

U.S. PATENT DOCUMENTS 5,318,676  6/1994  Sailor et al. ........................... 204/129.3

OTHER PUBLICATIONS

Canham, Appl. Phys. Lett., vol. 57, No. 10, 3 Sep. 1990.
FuruKawa et al., Phys. Rev B, vol. 38, No. 8, 15 Sep. 1988.
Takagi et al. Appl. Phys. Lett., 56 (24) 11 Jun. 1990.
Jeff Hecht, Boston, Porous Chips Light Up in Colour, New Scientist, May,1991, p. 27.

H. Takagi, H. Ogawa, Y. Yamazaki, A. Ishizaki, and T. Nakagiri, Quantum Size Effects on Photoluminexcence in Ultrafine Si Particles, Applied Phys. Lett. 56 (24), Jun. 11, 1990.
S. Furukawaand T. Miyasato, Three–Dimensional Quantum Well Effects in Ultrafine Silicon Particles, Japanese Journal of Applied Physics, Nov., 1988, vol. 27, No. 11, pp. L2207–L2209.
L. Canham, Silcon Quantum Wind Array Fabrication by Electrochemical and Chemical Dissolution of Wafers, Appl. Phys. Lett 57 (10), Sep. 3, 1990.
S. Frurukawa and T. Miyasato Quantum Size Effects on the Optical Band Gap of Microcrystalline Si:H, The American Physical Society, Sep. 15, 1988, vol. 38, No. 8.
Ivan Amato, Putting Some Spark in Silicon, Research News, May 17, 1991, p. 923.
S. Tsao, T. Guilinger, M. Kelly, H. Stein, J. Barbour, and J. Knapp, Porous silicon oxynitrides formed by ammonia heat treatment, American Institute of Physics, Apr., 1990.

*Primary Examiner*—Charles Nold
*Attorney, Agent, or Firm*—Timothy D. Stanley

[57] ABSTRACT

A method is described for altering the luminescence of a light emitting semiconductor (LES) device. In particular, a method is described whereby a silicon LES device can be selectively irradiated with a radiation source effective for altering the intensity of luminescence of the irradiated region.

21 Claims, 4 Drawing Sheets

METHOD FOR ALTERING THE LUMINESCENCE OF A SEMICONDUCTOR

The United States Government has rights in this invention pursuant to Contract No. DE-AC04-76DP00789 between the Department of Energy and American Telephone and Telegraph Company.

BACKGROUND OF THE INVENTION

The present invention relates generally to a method for altering the luminescence of semiconductors and, more particularly, to a method for producing light emitting semiconductor (LES) devices having regions of varying luminescence.

Integrated circuits are becoming increasingly smaller and more densely occupied resulting in bottlenecks in the transmission of data along electrical pathways. While the use of optical pathways could greatly enhance the flow of data, finding a material which is both compatible with integrated circuit materials and one which could be used as an optical pathway as well as for new types of displays, signal processors and optical computers has long been a desire of the microelectronics industry. In particular, the use of silicon for optical pathways would integrate far more easily and cheaply with standard silicon-based semiconductor devices than current practices of adapting other materials with such devices.

Until recently, attempts to use silicon as the material for both the optical and electronic circuits of an integrated circuit have been littered with failure. With the recent revelations of S. Furukawa, et al in "Quantum size effects on the optical band gap of microcrystalline Si:H" Phys.Rev. B Vol. 38, 5726 (1988) and in "Three-dimensional quantum well effects in ultra fine silicon particles" Jpn. J. Appl. Phys. 27, L2207 (1988); H. Takagi, et al in "Quantum size effects on photoluminescence in ultra fine Si particles" Appl. Phys. Lett. 56, 2379 (1990); and L. T. Canham, in "Silicon quantum wire array fabrication by electrochemical and chemical dissolution of wafers" Appl. Phys. Lett. 57, 1046 (1990), methods for fabricating light emitting semiconductor (LES) devices from silicon have been developed. The essence of such methods is to produce a porous silicon structure on a silicon substrate wherein the porous structure comprises nanometer sized wires of silicon or a sponge-like structure of silicon. Both photoluminescence and electroluminescence have been demonstrated in such porous silicon structures. Nevertheless, for such porous silicon structures to be used as an optical pathway as well as for new types of displays, signal processors and optical computers, a need still exists to produce regions of the LES having specified intensities of luminescence.

SUMMARY OF THE INVENTION

The present invention relates generally to a method for altering the luminescence of semiconductors and, more particularly, to a method for producing light emitting semiconductors (LES) having regions of differing luminescence. A LES can be selectively irradiated with a radiation source effective for altering the intensity of luminescence of the irradiated region of the LES. Moreover, the irradiated region of the LES can be irradiated so as to achieve a predetermined intensity of luminescence. Radiation sources effective for altering the luminescence of the irradiated region of the LES include: ion beams, electron beams, x-rays, gamma-ray and neutrons. The light emitting semiconductor material can include both naturally occurring luminescent material as well as semiconductor materials which can be made to luminesce. These and other advantages of the present invention will be discussed more completely below.

BRIEF DESCRIPTION OF THE DRAWINGS

The accompanying drawings, which are incorporated in and form part of the specification, illustrate the present invention and, together with the description, serve to explain the invention.

DETAILED DESCRIPTION OF THE INVENTION

In order to better understand the present invention, the following introductory discussion is provided. Semiconductors can be made to carry a current when electrons (usually contributed by deliberately implanted impurity atoms) gain enough energy to boost them from their valence band to a higher energy band referred to as the conduction band. The difference in energy between the two bands is generally referred to as the band-gap energy. A semiconductor can emit light when electrons in the conduction band cascade back to the valence band releasing band-gap energy as light. Light emitting materials now used as optical pathways in integrated circuits (e.g. gallium arsenide) have what are known as direct band-gaps, which means that an energized electron in the conduction band returns directly to the valence band releasing the full band-gap energy as light. Unfortunately, crystalline silicon, the fundamental building block material of the semiconductor industry, has an indirect band-gap. Consequently, the return of energized electrons from its conduction band to the valence band typically comprises several intermediate steps which make the light emission process less probable. Moreover, the band-gap energy of crystalline silicon is too narrow to generate visible light even when rare direct recombinations do occur.

Figure 1:
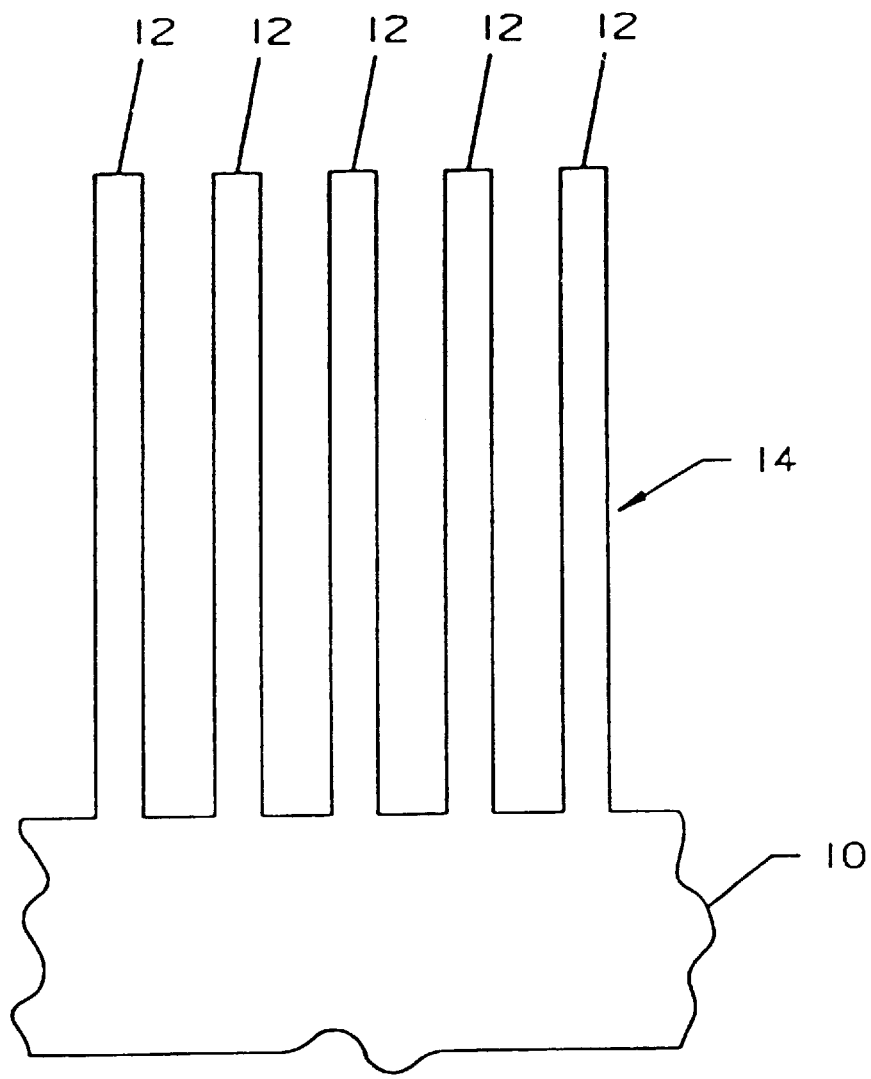
FIG. 1 is a schematic representation of one possible cross-section of a light emitting semiconductor (LES) comprising a substrate having a porous layer thereon formed by a plurality of ultra fine wires or pillars of the substrate material.

As previously discussed, Takagi, Furukawa and Canham have each described various techniques for forming a luminescent layer of material on a substrate from a typically non-luminescent material in bulk form. In particular, Takagi and Furukawa describe a RF sputtering technique whereby a plurality of ultra fine microcrystallites of silicon can be deposited onto a silicon substrate, while Canham describes an alternative method whereby an electrochemical etch is employed to form a porous silicon layer on a silicon substrate wherein the porous layer comprises a plurality of ultra fine or microcrystalline wires of dimensions similar to those of the RF sputtering technique. Alternative methods for producing such a luminescent layer include forming a porous, sponge-like structure on the substrate as well as forming a layer of hydrogenated amorphous semiconductor (e.g. a-Si:H) on the substrate. FIG. 1 depicts a semiconductor substrate 10 having formed thereon a porous layer 14 composed of a plurality of ultra fine or microcrystalline wires or pillars 12 as described by Furukawa, Takagi and Canham, all of which is incorporated by reference herein.

Making luminescent silicon devices in a way compatible with integrated circuits has long been an aspiration of the microelectronics industry. The essence of such methods is to produce a porous structure of microcrystalline silicon or amorphous silicon having structural dimensions small enough to efficiently luminesce at room temperatures. Typically, such porous have dimensions measured in nanometers (e.g. 2–7 nm). While the exact nature of this phenomena is unclear, it has been explained by Furukawa, Takagi and Canham in terms of the decreasing dimensions of the ultra fine silicon structure so as to cause the band-gap energy of silicon to increase. Since the techniques for fabricating such ultra fine silicon structures can result in variation in diameters, there can be corresponding variations in the band-gap energies for a specimen having a plurality of such ultra fine structures. As a consequence, the particular wavelength (color) of the emitted luminescent light can depend upon the dimensions of the ultra fine structures.

Furukawa, Takagi, Canham and others have established the capability as well as specific methods for converting a non-luminescent material into a luminescent material. Hereafter, such materials will simply be referred to as light emitting semiconductors (LES) which is intended to include silicon as well as other semiconductor materials whether or not such materials naturally luminescence or can be made to luminescence according to the teachings of Takagi, Furukawa or Canham. By way of example and not limitation, LES materials are understood to include silicon, germanium, Si:H, a-Si:H (hydrogenated, amorphous silicon) and gallium arsenide. The present invention provides methods whereby the luminescence of such materials can be altered. Surprisingly, the present invention also provides a unique method for selectively altering properties of a semiconductor wafer without resort to selective chemical or electrochemical processes which employ a pattern or mask to limit the extent of such processes. As such, the entire wafer can be first processed by either a chemical or electrochemical process and thereafter regions of the wafer can be selectively altered by irradiating such regions.

Figure 2:
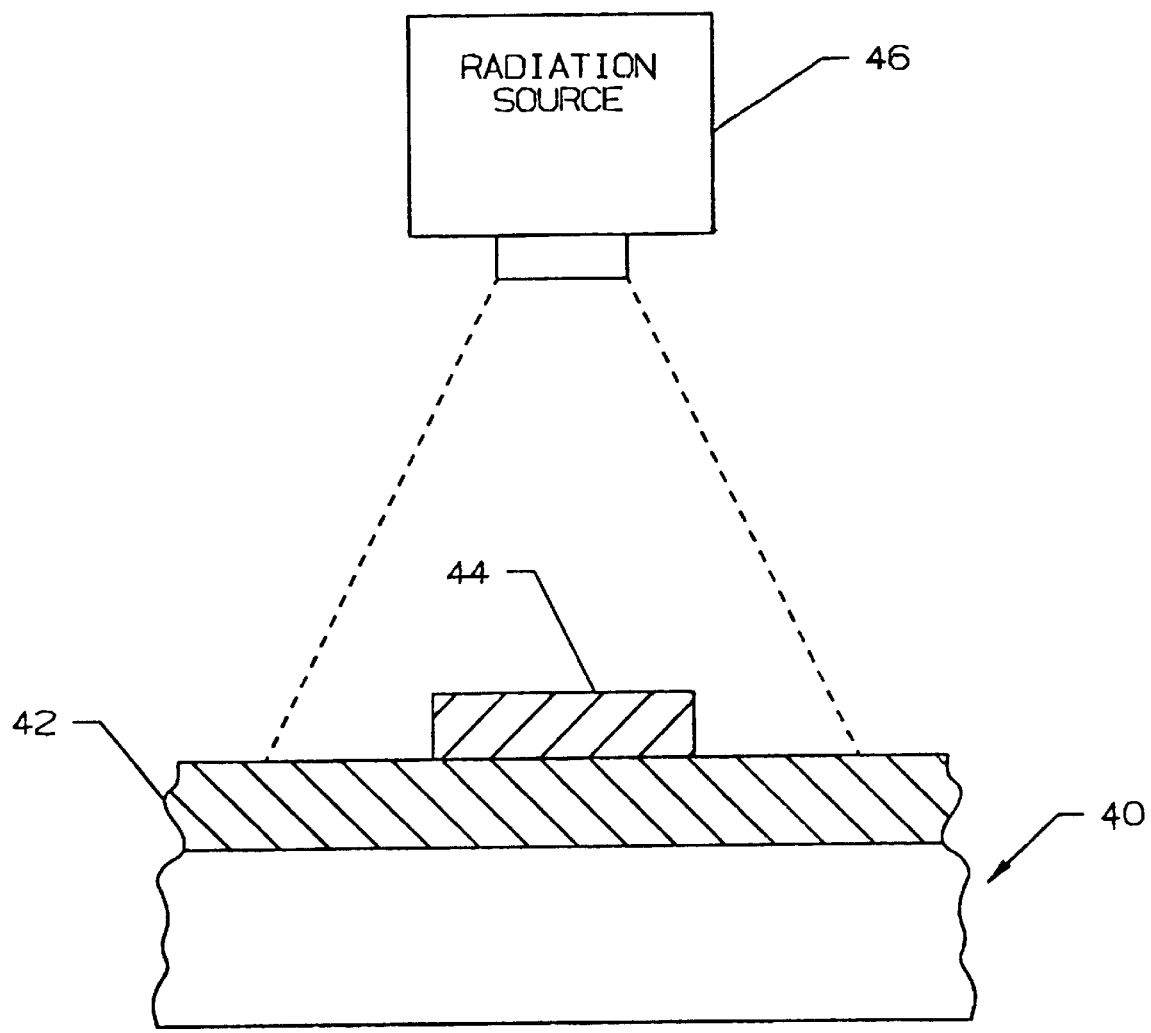
FIG. 2 a method is depicted for selectively irradiating a LES to alter the luminescence of the irradiated region of the LES according to the present invention.

Looking now to FIG. 2, the present invention will be described in more detail. A LES device 40 is first fabricated by anyone of the above discussed techniques. In particular, the LES 40 includes a porous layer or microcrystalline structure 42 composed of the semiconductor material comprising the LES 40. One such method is more completely described below.

The LES 40 can be irradiated with a radiation source 46 effective for altering the luminescence of the irradiated portions of the porous layer or structure 42. Such radiation sources 46 can include: ion beam, electron beam, gamma-ray, x-ray and neutron. As will be discussed more fully below, only selected regions of the LES 40 and porous layer 42 can be irradiated by interposing a shielding device 44 between the radiation source 46 and the LES 40. Those skilled in the art will appreciate that other methods exist for selectively irradiating only a portion of the LES 40 such as the use of focused radiation sources.

Figure 4:
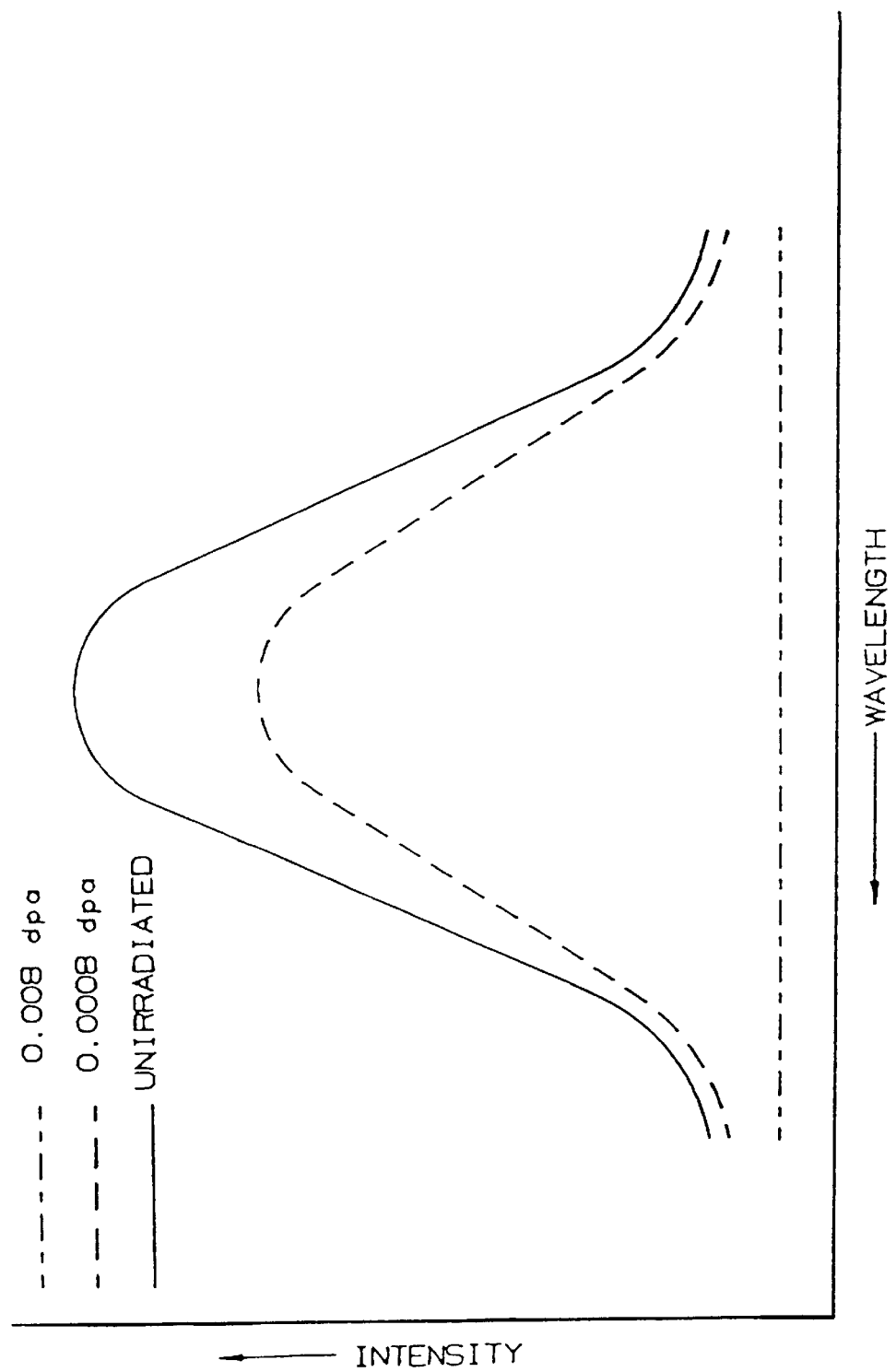
FIG. 4 represents a measure of the intensity of luminescence of a LES device irradiated at different fluences of Ne ion beam. The luminescence was stimulated by exposure to an argon laser beam at a fixed power and wavelength.

It has been found that gradations in the intensity of luminescence of the porous layer 42 of the LES 40 can be achieved by varying the fluence of the irradiating beam and by varying the energy level of the irradiating beam as depicted in FIG. 4 and explained further below. When the porous layer material is silicon, gradations in its intensity of luminescence can be achieved by limiting the level of radiation damage to a maximum of 0.008 displacements per atom (dpa). Generally, as the level of radiation damage increases from zero, the luminescence of the porous layer 42 decreases until the maximum level of radiation damage is achieved, at which point the luminescence of the porous layer 42 is substantially eliminated. It has also been discovered that the use of higher energy radiation sources (e.g. 24 MeV/Cl ion beam source as opposed to a 250 KeV Ne ion beam source) can achieve a uniform or constant level of radiation damage in the irradiated portion of the porous layer 42 of the LES 40.

EXAMPLE

In this example, a substrate wafer comprising a (100)-oriented, 1 Ω-cm resistivity, boron-doped, p-type silicon was used. A porous silicon layer was formed thereon using a double-tank electrochemical cell containing 5 wt. % HF in $H_2O$ and using a 0.5 mA/cm² anodization current density. The porous silicon layer formed had a thickness of 290 nm and a porosity of 73%. Generally, it has been found that such etching process will produce a porous structure sufficient for luminescence provided that porosity levels in excess of ~70% can be achieved. The porous silicon layer was formed only within a 2.75 inch diameter circular area at the center of the 4 inch diameter substrate wafer. Under room lights and at room temperature, the porous silicon layer varied in color from a golden yellow at the center to purple and green at its outer edge.

Samples (6.5 mm×13 mm) of uniform color were cleaved from the center of the wafer and a selected region of the sample was irradiated with an ion beam radiation source of 24 MeV $Cl^{+5}$, incident at 75° from the sample normal. The peak of the radiation damage to the substrate layer of the sample was 2.3 dpa. The sample was exposed to a fluence of $5.6 \times 10^{14}$ ions/cm² in a rectangular area 1.3 mm×3.3 mm of the sample. That is, not all of the sample was exposed to the radiation beam. In order to form amorphous structures, radiation damage levels in silicon generally must be of the order of $\geq 0.8$ dpa. The level of damage throughout the porous silicon layer was approximately constant at 0.08 dpa ($\leq 1/10$ that needed for amorphization).

An argon laser was used as an excitation source at the following wavelengths: 514.5 nm, 496 nm, 476 nm, and 457 nm. The laser beam was incident at an angle of 60° from the sample normal. The incident light was spread with a defocusing lens to a 4 mm tall by 8 mm wide spot in order to encompass the entire irradiated region as well as a portion of the non-irradiated region portion of the sample. A variable attenuator was placed between the light source and the sample and the power density for each wavelength was varied from 35 mW/cm² to 685 mW/cm². The emitted luminescent light was collected via a fiber optic cable attached to a monochromator having a 150 lines/mm grating. The room-temperature luminescent spectrum was then detected with a thermoelectrically-cooled CCD area-array photo detector.

Figure 3:
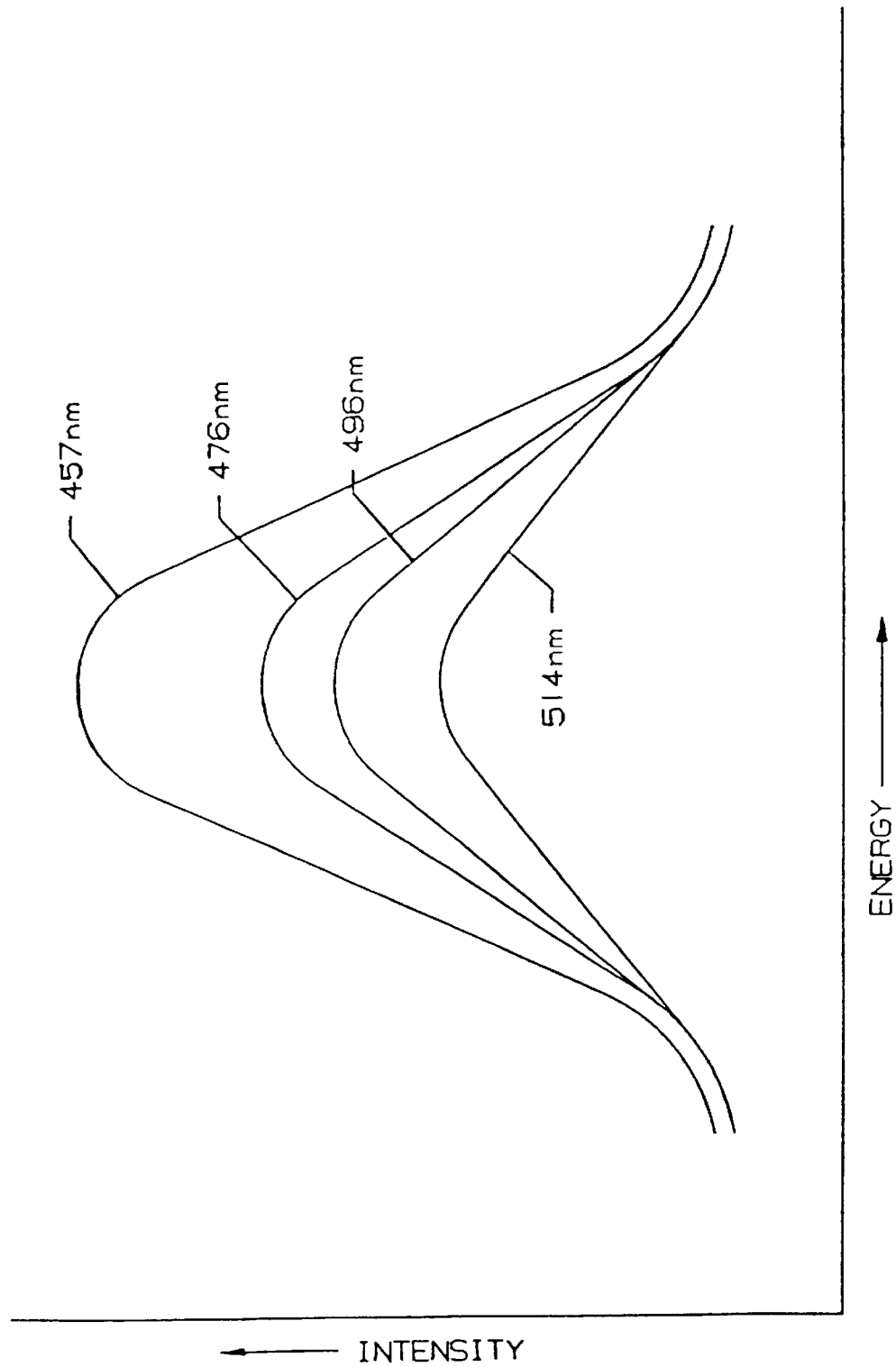
FIG. 3 represents a measure of the intensity of luminescence of LES device exposed to an argon laser beam of fixed power at four different wavelengths.

The luminescent intensity from the region of the sample which was not irradiated with the ion beam is depicted in FIG. 3. In particular, light emission from the sample was stimulated with an argon laser operating at a fixed power density (410 mW/cm2) and at four different wavelengths (e.g. 457 nm, 476 nm, 496 nm and 514 nm). The large breadth of the luminescent spectra in this figure is believed to be due to a distribution in size of the structure comprising the porous layer. The luminescent wavelength of each luminescent spectra are at essentially the same value of 735 nm±5 nm and appear to be independent of the excitation wavelength.

Similar results were also obtained with more conventional ion beam radiation sources, such as a 250 kev Ne ion beam radiation source. In particular, a second set of samples were irradiated using the Ne ion beam source with fluences ranging from $4\times10^{12}$ ions/cm$^2$ to $4.44\times10^{14}$ ions/cm$^2$. Such fluences resulted in the following corresponding ranges of level of radiation damage in the porous layer from 0.0008 dpa to 0.008 dpa. Excitation of the porous layer with an argon laser beam of fixed power density resulted in a luminescent spectra depicted in FIG. 4 where luminescent intensity decreased as the level of radiation damage to the porous layer increased. In particular, a 20% decrease in the intensity of luminescence was achieved at a radiation damage level of 0.0008 dpa as depicted in FIG. 4. FIG. 4 also represents that luminescence of the porous layer has been substantially eliminated at a radiation damage level of 0.008 dpa.

While the present invention has been described with the aid of specific semiconductor material, radiation sources and exciting laser beams, those skilled in the art will appreciate that variations thereof can be made, and that the present invention is to be limited only by claims attached herewith.

We claim:

1. A method for altering the luminescence of a light emitting semiconductor (LES) device comprising selectively irradiating regions of the LES device with a radiation source effective for altering the luminescence of the irradiated region.

2. The method of claim 1, wherein the LES material is selected from the group including: silicon, germanium, Si:H, a-Si:H and gallium arsenide.

3. The method of claim 1, wherein the radiation source is selected from the group including: ion beam, neutron, gamma-ray, x-ray and electron beam.

4. The method of claim 1, wherein the LES material comprises a semiconductor which is not a naturally occurring luminescent material.

5. The method of claim 1, wherein a first region of the LES is irradiated with a radiation source effect achieving a predetermined intensity of luminescence.

6. The method of claim 1, wherein the LES material comprises a semiconductor which is a naturally occurring luminescent material.

7. A light emitting semiconductor (LES) device, comprising:
    a) a substrate; and
    b) a selectively irradiated luminescent layer formed on the substrate, wherein the luminescent layer includes regions capable of differing intensities of luminescence.

8. The LES device of claim 7, wherein the substrate comprises a semiconductor material.

9. The LES device of claim 7, wherein the luminescent layer comprises a semiconductor material.

10. The LES device of claim 7, wherein the luminescent layer comprises an ultra fine structure of wires having lateral dimensions of 2–7 nm.

11. The LES device of claim 7, wherein the luminescent layer comprises a porous structure having a porosity>70%.

12. The LES device of claim 7, wherein the layer is selectively irradiated with a radiation source selected from the group consisting of: ion beam, electron beam, x-ray, gamma-ray and neutron.

13. The LES device of claim 7, wherein the substrate material is silicon.

14. The LES device of claim 7, wherein the luminescent layer material is selected from the group including: silicon, Si:H, a-Si:H, germanium and gallium arsenide.

15. The LES device of claim 7, wherein the luminescent layer comprises a naturally occurring luminescent material.

16. The LES device of claim 7, wherein the luminescent layer comprises a non-naturally occurring luminescent material.

17. A light emitting semiconductor (LES) device, comprising irradiated luminescent material having regions capable of differing intensities of luminescence.

18. The LES device of claim 17, wherein the luminescent material has been selectively irradiated to achieve regions capable of predetermined intensities of luminescence.

19. The LES device of claim 17, wherein the luminescent material has been selectively irradiated with radiation selected from the group consisting of: ion beam, electron beam, x-ray, gamma-ray and neutron.

20. A light emitting semiconductor (LES) device, comprising:
    a) a substrate; and
    b) a porous layer of luminescent material formed on a substrate, wherein the layer of luminescent material is further composed of regions of irradiated and non-irradiated luminescent material capable of differing intensities of luminescence.

21. A light emitting semiconductor (LES) device, comprising:
    a) a substrate; and
    b) a porous layer of semiconductor material formed on the substrate, wherein the layer of semiconductor material is further composed of regions of irradiated and non-irradiated semiconductor material capable of differing intensities of luminescence.

* * * * *